United States Patent [19]

Araki

[11] Patent Number: 5,564,889
[45] Date of Patent: Oct. 15, 1996

[54] SEMICONDUCTOR TREATMENT SYSTEM AND METHOD FOR EXCHANGING AND TREATING SUBSTRATE

[75] Inventor: Shinichiro Araki, Kumamoto, Japan

[73] Assignees: Tokyo Electron Limited, Tokyo; Tokyo Electron Kyushu Limited, Tosu, both of Japan

[21] Appl. No.: 262,329

[22] Filed: Jun. 17, 1994

[30] Foreign Application Priority Data

Jun. 18, 1993  [JP]  Japan ................................. 5-172672

[51] Int. Cl.⁶ ........................................... B65G 35/00
[52] U.S. Cl. .......................... 414/786; 414/222; 414/749; 414/935
[58] Field of Search .................................. 414/222, 749, 414/729, 935, 937; 294/907

[56] References Cited

U.S. PATENT DOCUMENTS

| | | | |
|---|---|---|---|
| 4,775,281 | 10/1988 | Prentakis | 414/937 X |
| 5,004,399 | 4/1991 | Sullivan et al. | 414/729 |
| 5,151,008 | 9/1992 | Ishida et al. | 414/749 X |
| 5,297,910 | 3/1994 | Yoshioka et al. | 414/935 X |
| 5,364,222 | 11/1994 | Akimoto et al. | 414/416 |

*Primary Examiner*—Donald W. Underwood
*Attorney, Agent, or Firm*—Oblon, Spivak, McClelland, Maier & Neustadt, P.C.

[57] ABSTRACT

A resist coating system for semiconductor wafers has a treatment unit and a transfer unit. The treatment unit has a plurality of treatment sections, and a transfer robot moves along the treatment sections. The transfer robot has a vertically movable driving block and first, and second and third arms for holding the semiconductor wafers, which are vertically arranged on the driving block and supported by the same such that they can advance and retreat independent of one another, and an adiabatic plate supported by the driving block between the third arm and the first and second arms. The third arm is used to take each wafer out of a cooling section, which is one of the treatment section. The wafer exchange in each treatment section is performed by means of two of the first through third arms. An arm for taking from the treatment section a wafer having been treated is operated in synchronism with another arm for inserting into the section a wafer to be treated.

13 Claims, 9 Drawing Sheets

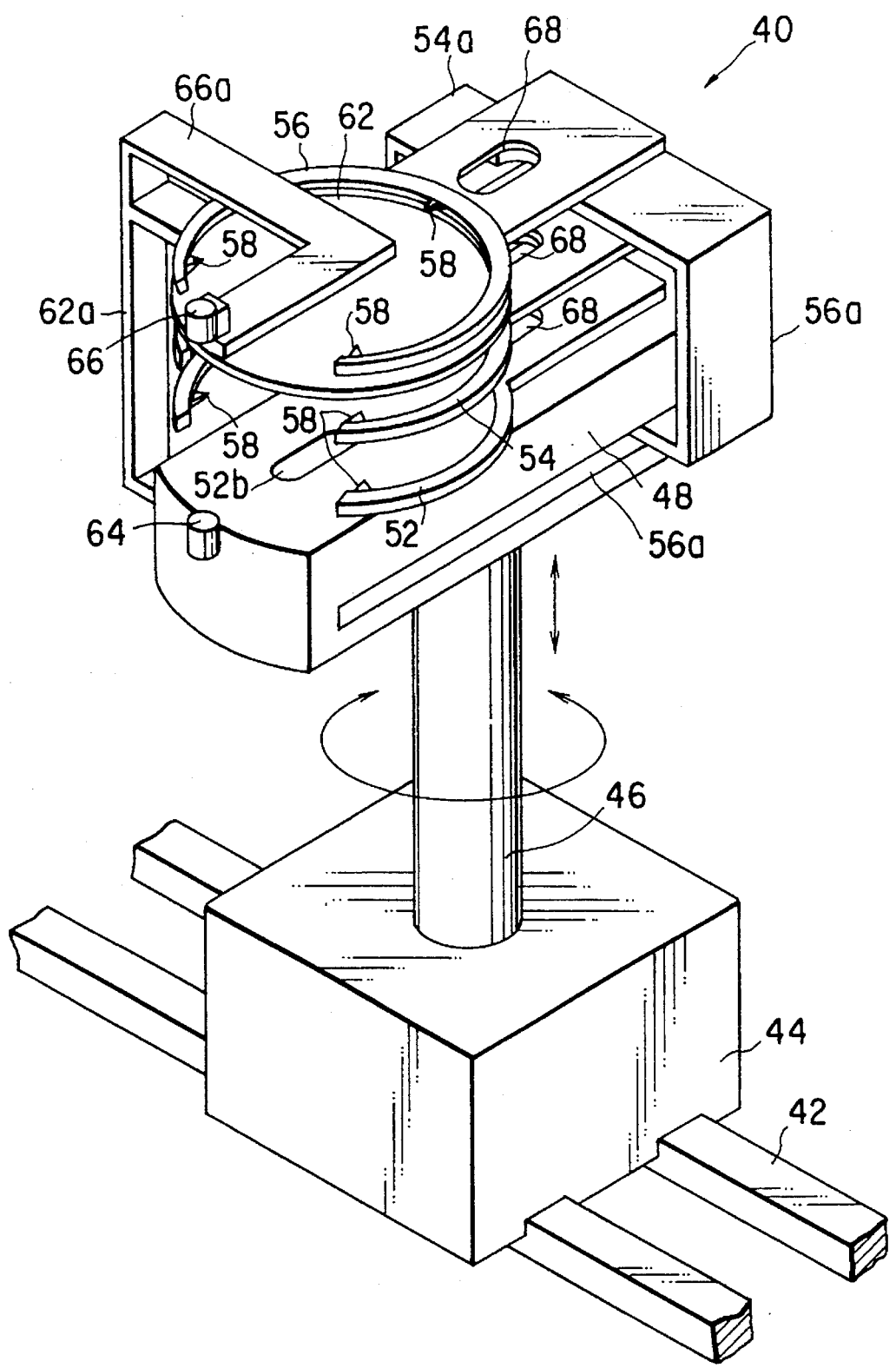
F I G. 5

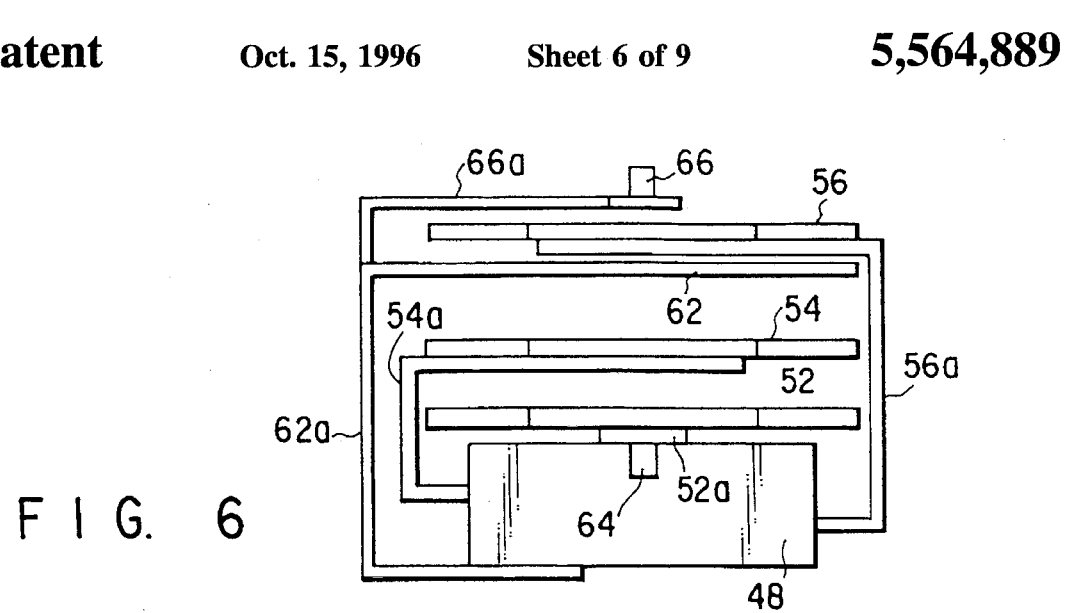
FIG. 6
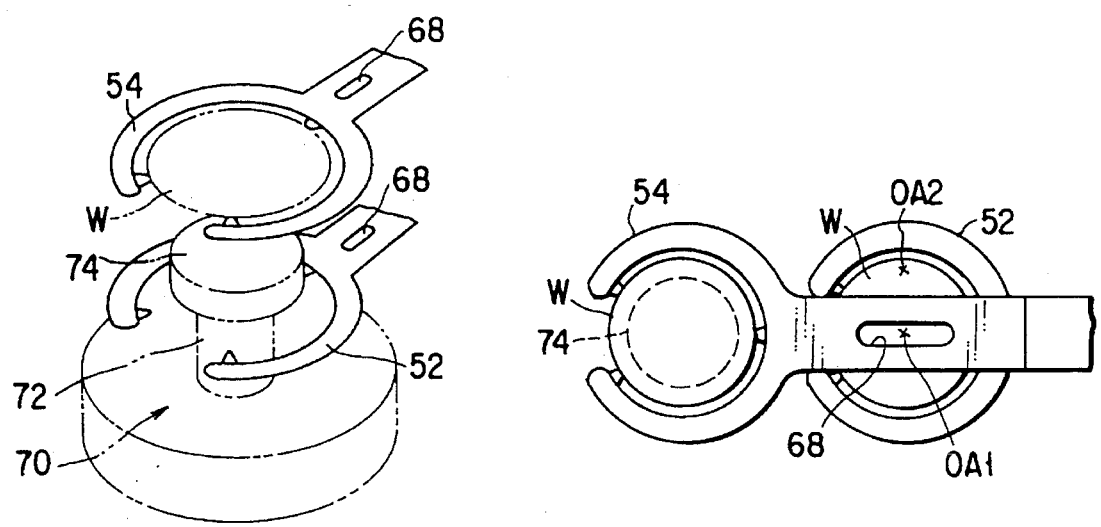
FIG. 7
FIG. 8
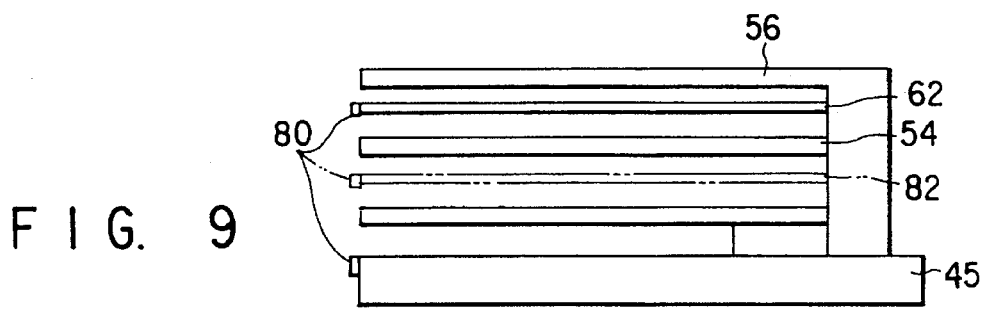
FIG. 9

SEMICONDUCTOR TREATMENT SYSTEM AND METHOD FOR EXCHANGING AND TREATING SUBSTRATE

BACKGROUND OF THE INVENTION

1. Field of the Invention

This invention relates to a semiconductor treatment system and a method for exchanging and treating substrates such as semiconductor wafers and LCD substrates.

2. Description of the Related Art

In the manufacturing process of a semiconductor device or an LCD (liquid crystal display) device, a resist coating system or a resist developing system is used. Such a system performs wafer exchange in a treatment section with the use of a transfer robot having two forked arms. FIGS. 1A to 1H and FIGS. 2A to 2H show conventional procedures for wafer exchange.

FIGS. 1A to 1H show a procedure of exchanging, in a treatment section, a wafer W1 placed on a work table, which has been treated, with a wafer W2 placed on a lower arm 4, which is to be treated next.

Referring to FIG. 1A, an upper arm 6 is raised, together with the lower arm 4, to a level at which the arm 6 can be inserted under the wafer W1 which has been treated, and then the upper arm 6 is advanced to the wafer W1. Thereafter, a support portion 2 supporting the arms 4 and 6 is moved upward to cause the arm 6 to raise the wafer W1 (FIG. 1B). The upper arm 6 is then retreated, with the wafer W1 kept thereon (FIGS. 1C, 1D).

When the upper arm 6 is returned to the initial or retreat position, the support portion 2 is further raised to position the lower arm 4 higher than the work table (FIG. 1E). At this level, the lower arm 4 with the wafer W2 to be treated next is advanced toward the table (FIG. 1F). When the lower arm 4 has reached a position above the table, the support portion 2 is moved downward to transfer the wafer W2 from the arm 4 to the table (FIG. 1G). Subsequently, the lower arm 4 is retreated to the initial position (FIG. 1H).

FIGS. 2A to 2H show a procedure of exchanging a wafer W1 placed on the work table, which has already been treated, with a wafer W2 placed on the upper arm 6, which is to be treated next.

The lower arm 4 is raised, together with the upper arm 6, to a level at which the lower arm 4 can be inserted under the treated wafer W1, and then the lower arm 4 is advanced to the wafer W1 (FIG. 2A). Thereafter, the support portion 2 is moved upward to cause the arm 4 to raise the wafer W1 (FIG. 2B). The lower arm 4 is then retreated (FIGS. 2C).

Subsequently, the support portion 2 is lowered slightly, and the upper arm 6 with the wafer W2 placed thereon is advanced toward the work table (FIG. 2E). When the upper arm 6 has reached a position above the table, the support portion 2 is moved downward to transfer the wafer W2 from the arm 6 to the table (FIGS. 2F, 2G). Following transfer of the wafer W2, the upper arm 6 is retreated to the initial position (FIG. 2H).

FIG. 3 is a timing chart, useful in explaining the timing of wafer exchange. The left side portion of the chart indicates the timing of the wafer exchange shown in FIGS. 1A to 1H, while the right side portion indicates that of the wafer exchange shown in FIGS. 2A to 2H. As is evident from FIG. 3, the lower and upper arms can operate independent of each other, and the operations of the arms are performed on a continuous basis. In other words, after the unloading operation of the treated wafer W1 is finished, the loading operation of the wafer W2 to be treated is subsequently initiated. Thus, the time period required for wafer exchange is the sum of the time periods necessary to perform the unloading and loading operations.

If the time required for wafer exchange is long, it inevitably reduces the throughput. Further, if this is the case, then, a wafer to be subsequently treated will be adversely affected by the heat of a wafer having been treated or by the heat of the atmosphere, and accurate control of the temperature of the wafer will become difficult. For example, in a resist coating system, the longer the time period required for wafer exchange is, the higher the temperature of a wafer, which has been set to a predetermined value in a cooling section, is liable to become, due to the ambient temperature. As a result, the uniformity of the thickness of a resist film formed in a resist coating section is lowered.

The above disadvantage appears particularly in the case of treating a large substrate such as an LCD substrate. This is because long stroke arms must be used to unload and load large substrates, and the time periods required for the unloading and loading are inevitably long.

SUMMARY OF THE INVENTION

It is the object of the invention to shorten the time required for exchanging target substrates, such as semiconductor wafers, to increase the throughput, and to control the temperature of each substrate in a more reliable manner.

To attain the object, the invention provides a method of exchanging target substrates, employed in a semiconductor treatment system which has a transfer apparatus provided with a vertically movable base and upper and lower arms for transferring the substrates, the upper and lower arms being vertically arranged on the base and supported by the base such that they can advance and retreat independent of each other, wherein a first substrate which is one of the substrates is removed from a station located in the semiconductor treatment system, and a second substrate which is one of the substrates is transferred from one of the upper and lower arms onto the station, the station being formed such that each substrate can be transferred between the station and one of the upper and lower arms by moving the arm in horizontal and vertical directions;

the method comprising the following steps under the condition that the second substrate is initially held by the lower arm:

positioning the base at a lower level with the upper and lower arms positioned in their retreat positions, the lower level being set such that the upper arm can be kept out of contact with one of the substrates when it is positioned under the one of the substrates placed on the station;

advancing the upper arm to a position under the first substrate, with the base positioned at the lower level;

moving the base up to an upper level after positioning the upper arm under the first substrate, thereby raising the first substrate from the station by the upper arm, the upper level being set such that one of the substrates can be kept out of contact with the station when the lower arm is positioned above the station together with the one of the substrates;

retreating the upper arm after raising the first substrate by the upper arm;

starting to advance the lower arm with the second substrate held thereon, immediately before the base reaches the upper level or thereafter, and before or when starting to retreat the upper arm;

moving the base down to an intermediate level after positioning the lower arm above the station, thereby transferring the second substrate from the lower arm onto the station, the intermediate level being set such that the lower arm can be kept out of contact with one of the substrates when the lower arm is positioned under the one of the substrates which is placed on the station, and also such that one of the substrates can be kept out of contact with the station when the upper arm is positioned above the station together with the one of the substrates; and retreating the lower arm after transferring the second substrate onto the work table;

the method further comprising the following steps under the condition that the second substrate is initially held by the upper arm:

positioning the base at the intermediate level with both the upper and lower arms in their retreat positions;

advancing the lower arm to a position under the first substrate, with the base positioned at the intermediate level;

moving the base up to the upper level after positioning the lower arm under the first substrate, thereby raising the first substrate from the station by the lower arm;

retreating the lower arm after raising the first substrate by the lower arm;

starting to advance the upper arm with the second substrate held thereon, when or after starting to advance the lower arm and before or when starting to retreat the lower arm;

moving the base down to the lower level, thereby transferring the second substrate from the upper arm to the station, after positioning the upper arm above the station, and also after retreating the lower arm; and retreating the upper arm after transferring the second substrate onto the station.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 5 is a perspective view, showing a transfer robot employed in the system of FIG. 4;

FIG. 6 is a schematic front view, showing the transfer robot of FIG. 5;

FIG. 7 is a schematic perspective view, useful in explaining the relationship between a work table in a treatment section and the two arms of the robot of FIG. 5;

FIG. 8 is a schematic plan view, useful in explaining that relationship between the two arms of the robot of FIG. 5 at the time of confirming the existence of a wafer;

FIG. 9 is a schematic side view, showing a modification of the transfer robot of FIG. 5;

DETAILED DESCRIPTION OF THE PREFERRED EMBODIMENTS

The embodiments of the invention will be explained in detail with reference to the accompanying drawings.

Figure 4:
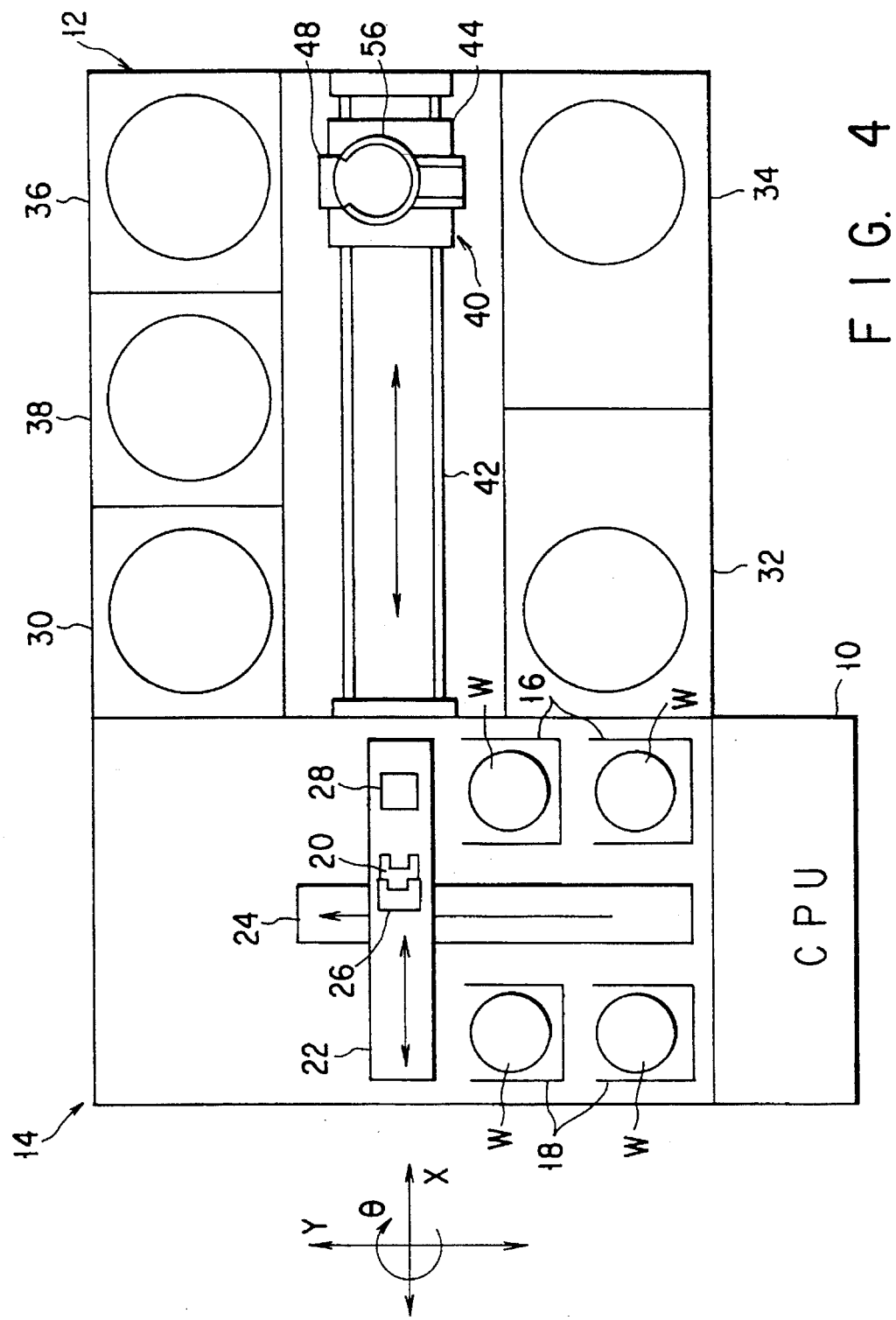
FIG. 4 is a schematic plan view, showing a resist coating system according to an embodiment of the invention.

FIG. 4 shows a resist coating system according to an embodiment of the invention. The resist coating system comprises a treatment unit 12 and a transfer unit 14. The treatment unit 12 has a plurality of treatment sections for performing various treatments to a substrate to be treated, such as a semiconductor wafer. The transfer unit 14 is used to transfer a wafer to and from the treatment unit 12. The treatment unit 12 and the transfer unit 14 are controlled by a CPU (central processing unit) 10 in accordance with predetermined programs.

The transfer unit 14 is formed to contain two wafer carriers 16 for receiving a wafer W to be treated, and two wafer carriers 18 for receiving a wafer W having been treated. The unit 14 has a transfer member 20 for transferring wafers to and from the carriers 16 and 18. The transfer of wafers between the transfer unit 14 and the treatment unit 12 is performed by way of a station table 28.

The transfer member 20 can be moved in X, Y and θ directions by means of an X-directional moving mechanism 22 and a Y-directional moving mechanism, each of which is formed by, for example, a combination of a stepping motor and a ball screw, and a θ-directional moving mechanism 26 formed by a stepping motor only.

The treatment unit 12 has an adhesion treatment section 30, coating sections 32, 34, a cooling section 36 and a baking section 38. Each section has a chamber and a work table located therein. In the adhesion treatment section 30, the surface of a wafer is treated to have hydrophobic properties in order to enhance the adhesion of a resist to the wafer. In the coating section 32 or 34, the wafer is coated with a resist film by a spin coater. In the cooling section 36, the temperature of the wafer to be coated with the resist is adjusted to a predetermined value (for example, about 23° C.). In the baking section 38, the wafer is heated, thereby evaporating a solvent remaining in the resist film coated on the wafer.

In the resist coating system shown in FIG. 4, there are provided the two coating sections 32 and 34 in order to increase the throughput of resist coating. Further, in the baking section 38, a plurality of baking devices are arranged in the vertical direction to heat a plurality of wafers at a time.

The treatment unit 12 contains a transfer robot 40 for transferring wafers into and out of the treatment sections 30 to 38. The robot 40 is movable along a transfer path 42 extending parallel to the treatment sections 30 to 38.

As is shown in FIG. 5, the robot 40 has a movable pedestal 44 engaged with the transfer path 42. The pedestal 44 is driven by a ball screw mechanism (not shown) to move along the transfer path 42. A shaft 46 projects from the pedestal 44. The shaft 46 can be moved in the vertical direction and rotated in a horizontal plane by means of a ball screw mechanism and a stepping motor contained in the pedestal 44.

A driving block 48 is fixed on the upper end of the shaft 46. Three arms 52, 54 and 56 shaped like a horse shoe are provided on the block 48. Each arm 52, 54 or 56 has three claws 58 which project from the inner periphery of the arm at regular intervals and is used to support a lower edge portion of a wafer. As is shown in FIG. 7, each arm 52, 54 or 56 has a cutout with a size which enables the rotary shaft 72 of a spin chuck 70 serving as a wafer holding portion to pass therethrough. The inner diameter of each arm 52, 54 or 56 and the claws 58 are arranged such that they do not interrupt the work table 74 of the spin chuck 70.

Each arm 52, 54 or 56 can perform a horizontal stroke by which it can move to and from a position under a wafer placed in a treatment section. Further, the driving block 48 can perform a vertical stroke which covers the range from a position in which the lowest arm 52 can start the transfer of a wafer, to a position in which the uppermost arm 56 can start to raise a wafer.

As is shown in FIG. 6, the arms 52, 54 and 56 are connected to driving means, contained in the block 48, via support frames 52a, 54a and 56a, respectively, and can be operated independent of one another. The frame 52a of the arm 52 is inserted in the block 48 through an elongated opening 52b formed in the upper plate of the block. The frame 54a of the arm 54 is inserted in the block 48 through an elongated opening (not shown) formed in a substantial center portion of the left side plate of the block, as is shown in FIGS. 5 and 6. The frame 56a of the arm 56 is inserted in the block 48 through an elongated opening 56b formed in a lower portion of the right side plate of the block, as is shown in FIGS. 5 and 6. A rotary driving mechanism consisting of a stepping motor and a ball screw operable in synchronism therewith, a belt-driven slide mechanism or the like is used as the driving mechanism of the arms 52, 54 and 56.

The arm 56 is mainly used to transfer a wafer from the cooling section 36 to the coating sections 32 and 34. An adiabatic plate 62 having a diameter larger than a wafer is provided between the arms 54 and 56 to prevent a wafer, which is held on the arm 56 after being controlled to a predetermined temperature in the cooling section 36, from cross contamination of heat by wafers placed on the lower arms 52 and 54. The adiabatic plate 62 is fixed to the block 48 by means of the frame 62a. Although in the embodiment, the arm for taking a wafer out of the cooling section 36 is located above the other arms, it is desirable to locate the arm for doing so under the other arms and provide the adiabatic plate 62 above it, in consideration of the fact that heated air flows upward.

A light emitting element 64 is fixed on a tip end portion of the driving block 48, and a light receiving element 66 is provided above the block 48 such that it is aligned with the light emitting element 64. The light receiving element 66 is attached to a frame 66a coupled with the frame 62a of the adiabatic plate 62. In other words, the light receiving element 66 is supported by the block 48 by means of the frames 62a and 66a. The light emitting element 64 and the light receiving element 66 form a light transmissive optical sensor for sensing the existence of wafers on the arms 52, 54 and 56. As is shown in FIGS. 7 and 8, a longitudinal slit 68 is formed in a handle portion of each of the arms, for allowing light pass therethrough when the slit 68 passes the optical axis OA1 (FIG. 8) of the sensors 64 and 66.

The optical sensor for sensing the existence of wafers on the arms 52, 54 and 56 may be of a reflection type. Further, the optical axis of the sensor may be set to pass a position (as indicated by OA2 in FIG. 8) outside the handle portions of the arms 52, 54 and 56, in which the wafer passes. Moreover, the optical sensor may be replaced with directly-detecting means such as a touch sensor, which operates when a wafer is placed on the arm 52, 54 or 56.

As is shown in FIG. 9, the adiabatic plate 62 can be used to support an optical sensor 80. Where a light transmissive optical sensor is used, the light emitting element and the light receiving element are supported by the driving block 48 and the adiabatic plate 62. In this case, however, the existence of wafers only on the lower two arms 52 and 54 can be detected. If a member which can function as a supporter 82 such as an adiabatic plate or a dummy wafer is provided between the arms 52 and 54, as indicated by the imaginary line in FIG. 9, the optical sensor 80 can be attached to the supporter member 82.

An explanation will now be given of a treatment method using the coating section 34, the cooling section 36 and the baking section 38, which is an example of a treatment performed in the resist coating system of the invention shown in FIG. 4. The elements on the transfer robot 40 which include the optical sensors 64 and 66 are controlled in accordance with the programs stored in the CPU 10.

First, a wafer W3 is set to a predetermined temperature in the cooling section 36, and taken out of the section 36 by means of the uppermost arm 56 on the robot 40. Then, the wafer is transferred along the transfer path 42 onto the work table in the coating section 34. Before placing the wafer W3 onto the work table by the arm 56, the wafer W2 which has already been coated with a resist film in the coating section 34 is taken therefrom by means of one (e.g. the arm 54) of the lower two arms. The procedure of the wafer exchange will be explained hereinafter. At the time of taking the wafer W2 from the coating section 34, it is confirmed, in a manner hereinafter referred to, whether the wafer W2 is on the arm 54. The confirmation result is stored in the CPU 10, and is used at the time of shifting to the next treatment. The wafer W3 placed on the table in the coating section 34 is coated with a resist film by the use of the spin coater.

On the other hand, the wafer W2 taken out of the coating section 34 by the arm 54 is transferred along the transfer path 42 onto the work table in the baking section 38. Before placing the wafer W2 onto the table in the section 38, the wafer W1 which has already been heated in the baking section 38 is taken therefrom by means of the lowest arm 52. The procedure of the wafer exchange in the section 38 will be explained hereinafter. At the time of taking the wafer W1 from the baking section 38, it is confirmed, in a manner hereinafter referred to, whether the wafer W1 is on the arm 52. The confirmation result is stored in the CPU 10, and is used at the time of shifting to the next treatment. The wafer W2 placed in the baking section 38 is heated, thereby evaporating a solvent remaining in the coated resist film.

A plurality of wafers are successively treated in the treatment sections 30 to 38 including the coating section 34, the cooling section 36 and the baking section 38. All the wafer treatments are controlled by the CPU 10 to which all data items are gathered from the treatment unit 12 and the transfer unit 14 which include the transfer robot 40 and the optical sensors 64 and 66, etc.

The procedure of wafer exchange according to the invention will be explained. For easy understanding, explanations regarding the arm 56 and the adiabatic plate 62 are omitted here, and only the two arms 52 and 54 will be explained. Actually, substantially the same wafer exchange operation as below can be performed both in the case of using the arms 56 and 52 and in the case of using the arms 56 and 54.

Figure 13:
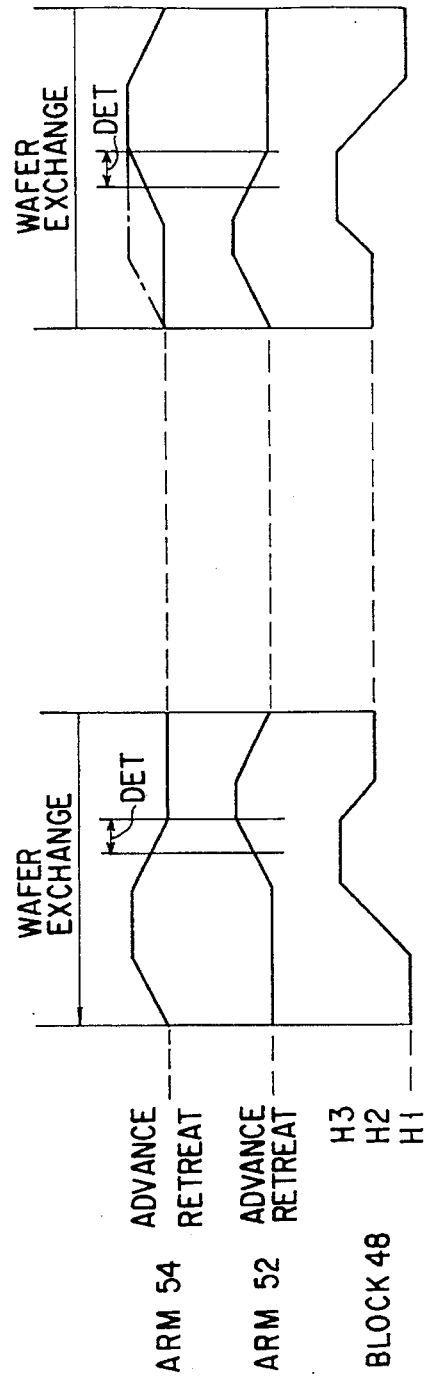
FIG. 13 is a timing chart, showing the timing at which wafer exchange according to the invention is performed.

FIGS. 10A to 10G show the procedure of wafer exchange in the case where the wafer W2 to be treated next is held on the lower arm 52, while FIGS. 11A to 11G show the procedure of wafer exchange in the case where the wafer W2 to be treated next is held on the upper arm 54. FIG. 13 is a timing chart, useful in explaining the timing of wafer exchange. The left side portion of the chart indicates the wafer exchange shown in FIGS. 10A to 10G, while the right side portion indicates that shown in FIGS. 11A to 11G.

Figure 10A:
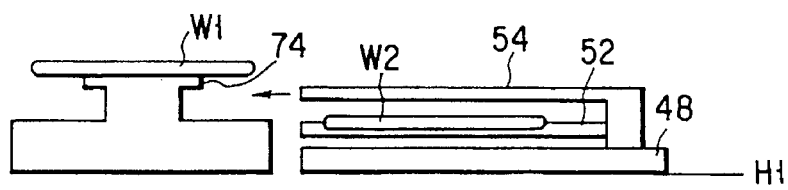
FIGS. 10A to 10G are schematic side views, showing a procedure of wafer exchange according to the invention.
Figure 10B:
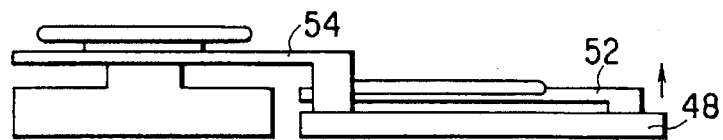
Figure 10C:
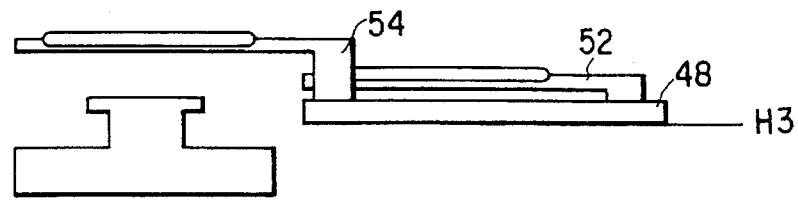

Referring to FIGS. 10A to 10G, the driving block 48 is set to a level H1 at which the upper arm 54 can be inserted under the treated wafer W1 in a treatment section (FIG. 10A), and then the arm 54 is advanced to the wafer W1 (FIG. 10B). At this time, the arm 54 is at a level at which the arm can be kept out of contact with the wafer. When the arm 54 has reached a position under the wafer W1, the driving block 48 supporting the arms 52 and 54 is raised to a level H3, thereby causing the arm 54 to raise the wafer W1 (FIG. 10C).

Figure 10D:
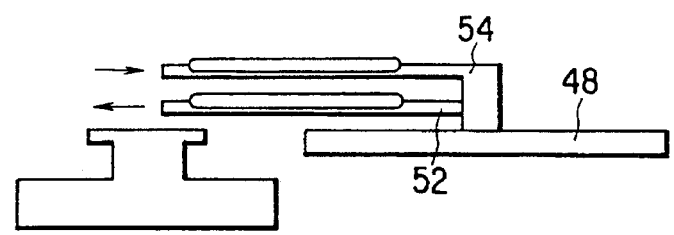

After the wafer W1 is transferred from the work table 74 onto the upper arm 54, the driving block 48 is stopped at the level H3. In this state, the lower arm 52 supporting the wafer W2 to be treated next starts to advance, while the upper arm 54 supporting the wafer W1 which has been treated starts to retreat (FIG. 10D). Adjusting the operation timing can cause the lower arm 52 to start advancing while the driving block 48 is raised.

Figure 10E:
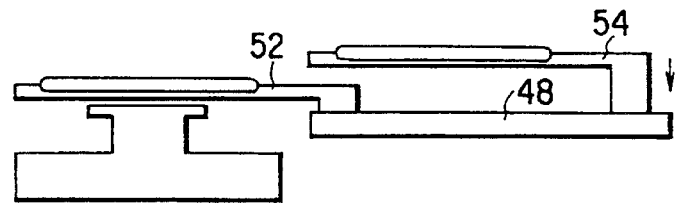
Figure 10F:
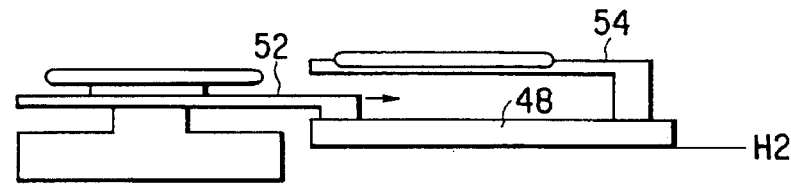
Figure 10G:
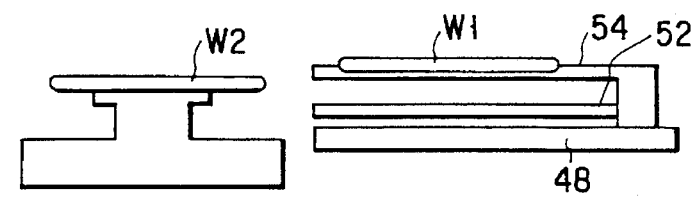

After the advance and retreat operations of the lower and upper arms 52 and 54 are finished, the driving block 48 starts to move downward (FIG. 10E). At this time, the upper arm 54 has returned to the initial position, i.e., to the retreat position. After the lower arm 52 transfers the wafer W2 onto the work table 74, the driving block 48 stops at a level H2 (FIG. 10F). In this state, the lower arm 52 returns to the initial position, i.e., to the retreat position (FIG. 10G).

Figure 11A:
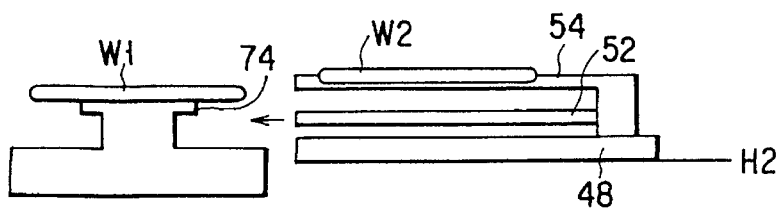
FIGS. 11A to 11G are schematic side views, showing another procedure of wafer exchange according to the invention.
Figure 11B:
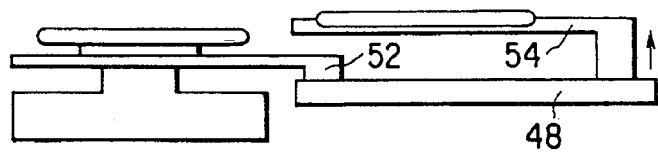
Figure 11C:
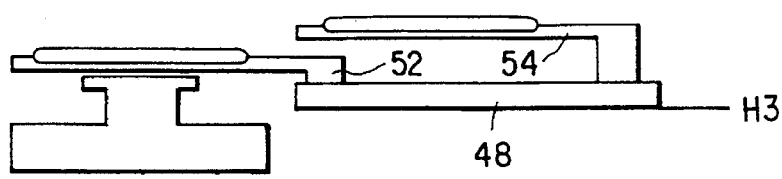

Referring then to FIG. 11A to 11G, the driving block 48 is set to the level H2 at which the lower arm 52 can be inserted under the wafer W1 in a treatment section (FIG. 11A). The level H2 is where the FIGS. 10A to 10G operation has been completed. Then, the arm 52 is advanced to the wafer W1 (FIG. 11B). At this time, the arm 52 is at a level at which it can be kept out of contact with the wafer. When the arm 52 has reached a position under the wafer W1, the driving block 48 supporting the arms 52 and 54 is raised to the level H3, thereby causing the arm 52 to raise the wafer W1 (FIG. 11C).

Figure 11D:
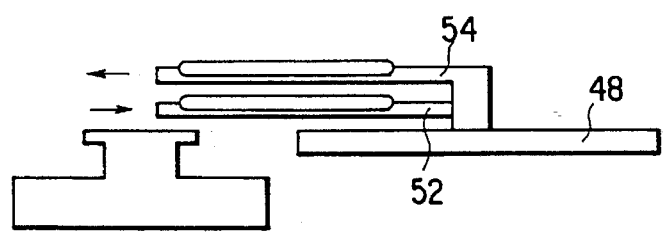

After the wafer W1 is transferred from the work table 74 onto the lower arm 52, the driving block 48 stops at the level H3. In this state, the upper arm 54 supporting the wafer W2 to be treated next starts to advance, while the lower arm 52 supporting the wafer W1 which has been treated starts to retreat (FIG. 11D).

Figure 11E:
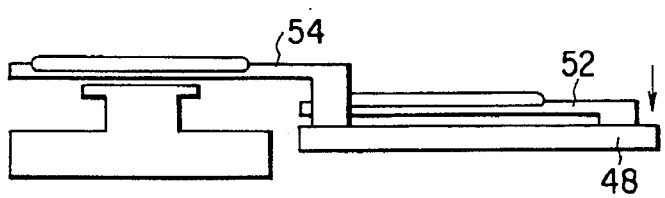
Figure 11F:
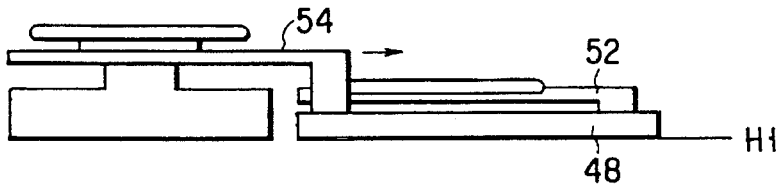
Figure 11G:
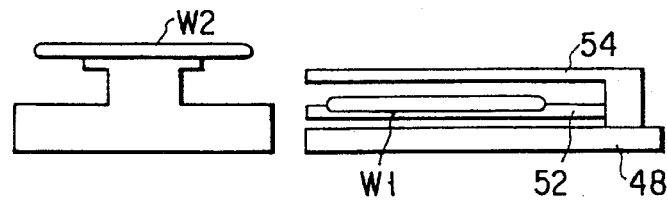

After the advance and retreat operations of the upper and lower arms 54 and 52 are finished, the driving block 48 starts to move downward (FIG. 11E). At this time, the lower arm 52 has returned to the initial position, i.e., to the retreat position. Adjusting the operation timing enables the driving block 48 to start downward moving while the advance of the upper arm 54 and the retreat of the lower arm 52 are performed. The driving block 48 is moved downward, and the wafer W2 is transferred from the upper arm 54 onto the work table 74 (FIG. 11F). The block 48 is further lowered and stopped at the level H1, and then the upper arm 54 is returned to the initial position, i.e., to the retreat position (FIG. 11G).

In the process of FIGS. 11A to 11D, the advance operation of the upper arm 54 can be initiated while the lower arm 52 is advanced, or at the same time as the start of the advance operation of the lower arm 52. FIGS. 12A to 12F show a modification of the process of FIGS. 11A to 11G devised in consideration of the above. The timing chart for the modification is substantially the same as the right side chart of FIG. 13 except for a portion indicated by the one-dot chain line.

Figure 12A:
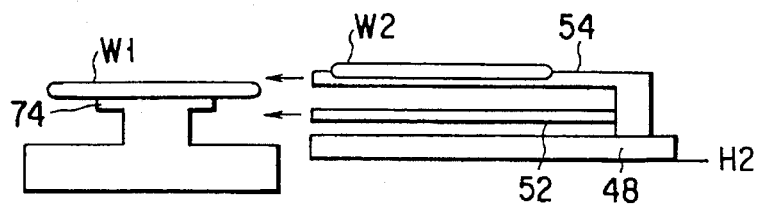
FIGS. 12A to 12F are schematic side views, showing a modification of the procedure of FIGS. 11A to 11G.
Figure 12B:
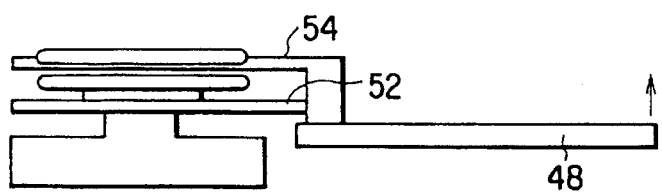
Figure 12C:
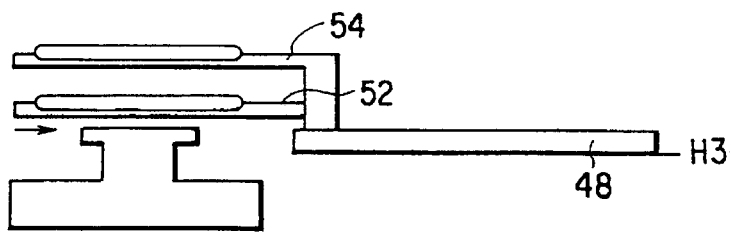

In FIGS. 12A to 12F, the driving block 48 is set to the level H2 at which the lower arm 54 can be inserted under the wafer W1 in a treatment section (FIG. 12A). The level H2 is where the FIGS. 10A to 10G operation has been completed. Then, the arms 52 and 54 are simultaneously advanced to the wafer W1 (FIG. 12B). At this time, the arms 52 and 54 are at a level at which they can be kept out of contact with the wafer W1. When the arms 52 and 54 have reached positions under and above the wafer W1, respectively, the driving block 48 supporting the arms 52 and 54 is raised to the level H3, thereby causing the lower arm 52 to raise the wafer W1 (FIG. 12C).

After the wafer W1 is transferred from the work table 74 onto the lower arm 52, the driving block 48 stops at the level H3. In this state, the lower arm 52 supporting the wafer W1 returns to the initial position.

Figure 12D:
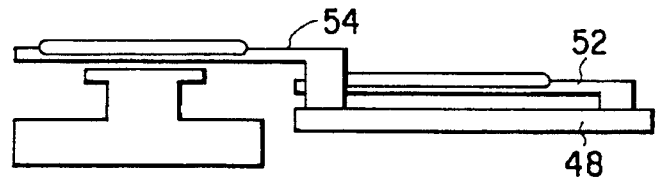
Figure 12E:
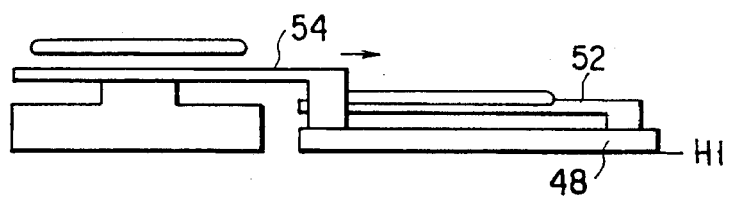
Figure 12F:
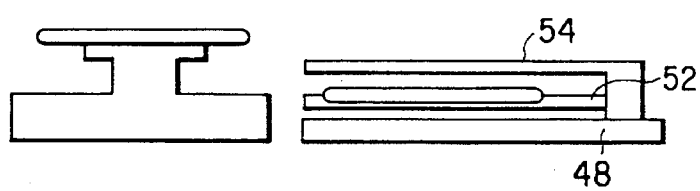

When the lower arm 52 has returned to the initial position, the driving block 48 starts to lower (FIG. 12D). Adjusting the operation timing enables the driving block 48 to start downward moving while the lower arm 52 is retreated. The driving block 48 is moved downward, and the wafer W2 is transferred from the upper arm 54 onto the work table 74 (FIG. 12E). The block 48 is further lowered and stopped at the level H1, and then the upper arm 54 is returned to the initial position, i.e., to the retreat position (FIG. 12F).

Figure 1A:
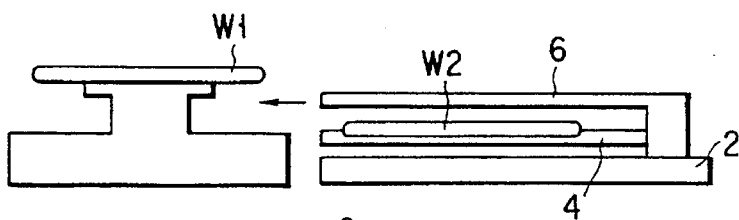
FIGS. 1A to 1H are schematic side views, useful in explaining a conventional procedure of exchanging wafers.
Figure 1B:
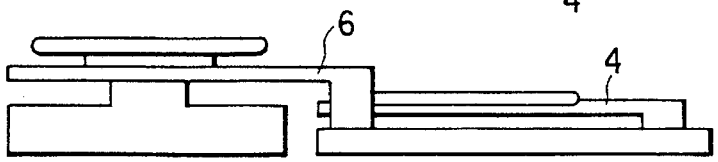
Figure 1C:
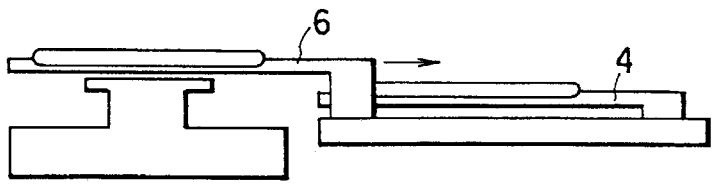
Figure 1D:
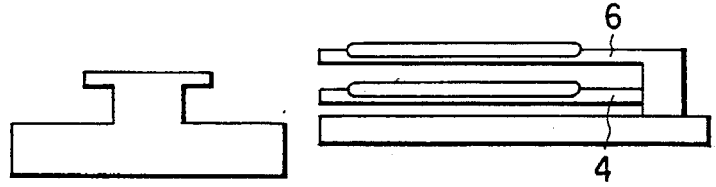
Figure 1E:
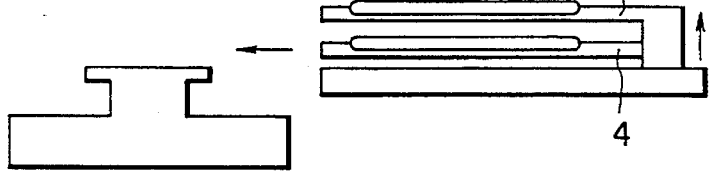
Figure 1F:
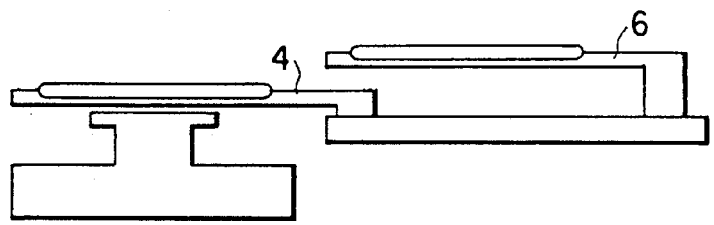
Figure 1G:
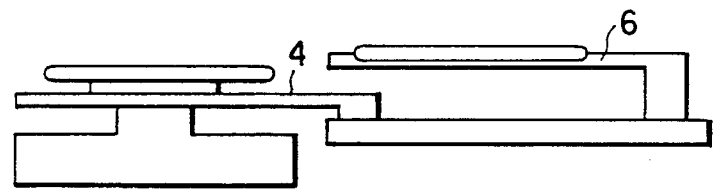
Figure 1H:
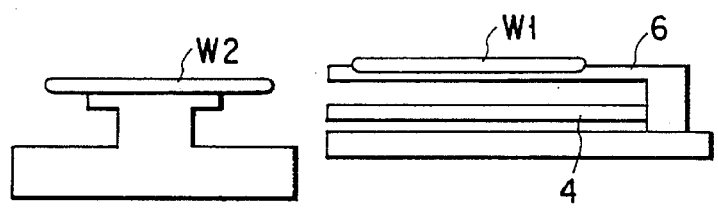
Figure 2A:
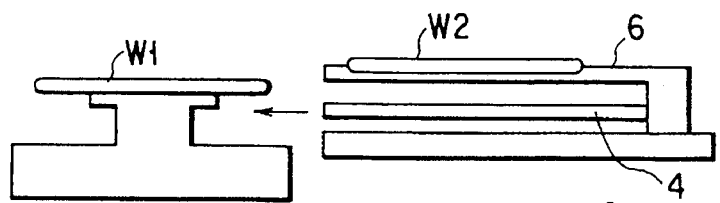
FIGS. 2A to 2H are schematic side views, useful in explaining another conventional procedure of exchanging wafers.
Figure 2B:
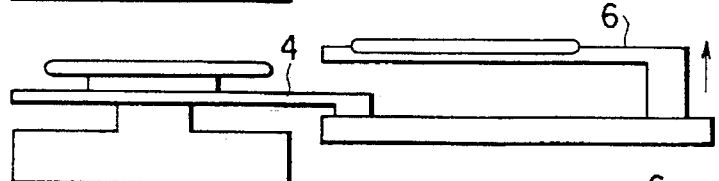
Figure 2C:
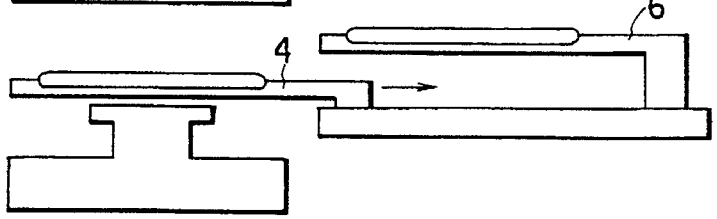
Figure 2D:
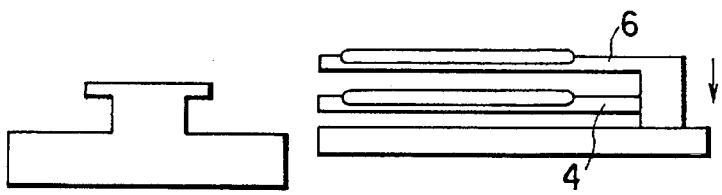
Figure 2E:
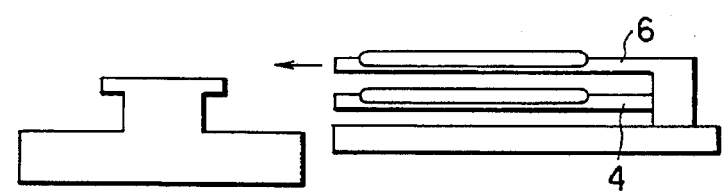
Figure 2F:
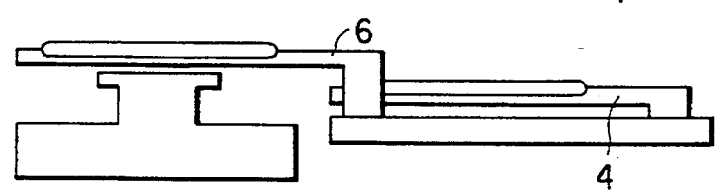
Figure 2G:
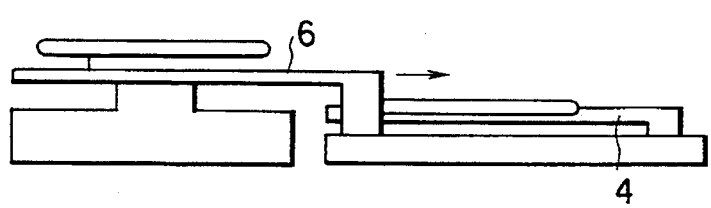
Figure 2H:
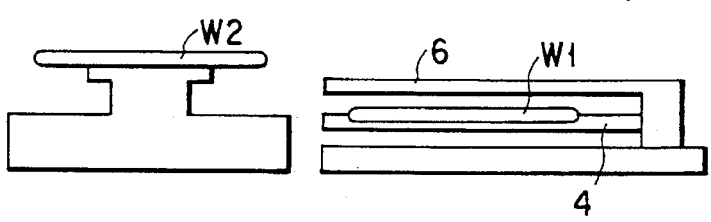
Figure 3:
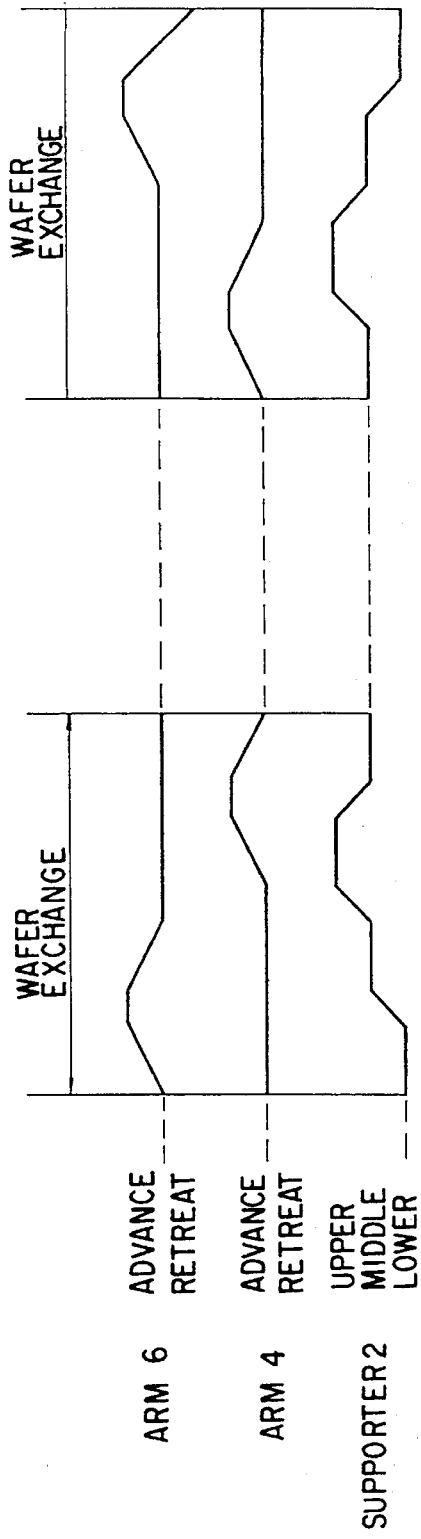
FIG. 3 is a timing chart, showing the timing at which the conventional wafer exchange is performed.

It is evident as a result of comparing FIGS. 13 and 3 that the time required to the wafer exchange in the present invention is shorter than the time required in the conventional wafer exchange. Therefore, the present invention can increase the throughput, and can reliably control the temperature of a wafer to be treated.

Further, in the present invention, by virtue of the optical sensors 64 and 66 and the slits 68 formed in the arms 52, 54 and 56, it is confirmed whether or not a wafer, which is expected to have been taken out of a treatment section by means of each arm 52, 54 or 56, is placed on the arm. This confirmation data is input to the CPU 10, and used at the time of shifting to the following treatment. As is shown in FIG. 8, the existence of a wafer is confirmed when the slit 68 of an arm and a wafer placed on another arm have simultaneously passed the optical axis OA1 of the optical sensors 64 and 66. In the embodiments shown in FIGS. 10A to 10G, 11A to 11G, and 12A to 12F, for example, a time period indicated by "DET" in FIG. 13 is an appropriate one.

The invention can further shorten the time required for wafer exchange by driving arms in the vertical direction while one of the arms is retreated and the other is advanced. For example, in FIGS. 10C and 10D, while the driving block 48 is moved upward, the retreat of the upper arm and the advance of the lower arm may be initiated. Further, in FIGS. 11D and 11E, while the lower arm is retreated and the upper arm 52 is advanced, the downward movement of the block 48 may be initiated. In the above cases, the upper and lower arms 54 and 52 are moved obliquely between their initial positions and the work table 70, not in the horizontal and vertical directions.

Moreover, to further shorten the time required for wafer exchange, the invention can be modified such that the arms 52, 54 and 56 are moved in the vertical direction independent of one another, thereby enabling the horizontal and vertical movements of all the arms to be performed in a desirable manner.

Although the invention is applied to a resist coating system in the above-described embodiments, it is also applicable to wafer or LCD exchange performed in a plasma treatment apparatus employing a multi-chamber system, or in a CVD (chemical vapor deposition) apparatus.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of exchanging target substrates, employed in a semiconductor treatment system which has a station for mounting each substrate, and a transfer apparatus provided with a base vertically movable among upper, intermediate and lower levels, and upper and lower arms for transferring the substrates, said upper and lower arms being vertically arranged on said base and supported by said base such that they can advance and retreat independent of each other, said station being formed such that each substrate can be transferred between said station and one of said upper and lower arms by moving said one of said arms in horizontal and vertical directions, wherein said upper level of said base is set such that one of the substrates can be kept out of contact with said station when said lower arm is positioned above said station together with said one of the substrates, said intermediate level of said base is set such that said lower arm can be kept out of contact with one of the substrates when said lower arm is positioned under said one of the substrates which is placed on said station, and also such that one of the substrates can be kept out of contact with said station when said upper arm is positioned above said station together with said one of the substrates, and said lower level of said base is set such that said upper arm can be kept out of contact with one of the substrates when it is positioned under said one of the substrates placed on said station, said method comprising, so as to remove a first substrate, which is one of the substrates and mounted on said station, from said station by said upper arm, and to transfer a second substrate, which is one of the substrates and supported by said lower arm, from said lower arm onto said station, the steps of:

positioning said base at said lower level with said upper and lower arms positioned in retreat positions;

advancing said upper arm to a position under said first substrate while said base being positioned at said lower level;

moving said base up to said upper level after positioning said upper arm under said first substrate, thereby raising said first substrate from said station by said upper arm;

retreating said upper arm with said first substrate and advancing said lower arm with said second substrate while said base being positioned at said upper level;

moving said base down to said intermediate level after positioning said lower arm above said station, thereby transferring said second substrate from said lower arm onto said station;

retreating said lower arm after transferring said second substrate onto said station; and confirming by an optical sensor as to whether said upper arm holds said first substrate while retreating said upper arm and advancing said lower arm, wherein said optical sensor comprises means for emitting light and means for receiving said light which are fixed relative to said base and connected to each other through an optical axis intersecting movement paths of said first and second substrates, and wherein said first substrate on said upper arm is sensed by said optical sensor when said optical axis intersects said first substrate on said upper arm and does not intersect said second substrate on said lower arm.

2. The method according to claim 1, wherein said retreat of said lower arm is initiated while said base being positioned at said intermediate level.

3. The method according to claim 1, wherein said retreat of said upper arm and said advance of said lower arm are performed substantially in synchronism.

4. The method according to claim 1, wherein an opening is formed in said lower arm such that said first substrate on said upper arm is sensed by said optical sensor when said optical axis intersects both of said opening of said lower arm and said first substrate on said upper arm at a same time.

5. A method of exchanging target substrates, employed in a semiconductor treatment system which has a station for mounting each substrate, and a transfer apparatus provided with a base vertically movable among upper, intermediate and lower levels, and upper and lower arms for transferring the substrates, said upper and lower arms being vertically arranged on said base and supported by said base such that they can advance and retreat independent of each other, said station being formed such that each substrate can be transferred between said station and one of said upper and lower arms by moving said one of said arms in horizontal and vertical directions, wherein said upper level of said base is set such that one of the substrates can be kept out of contact with said station when said lower arm is positioned above said station together with said one of the substrates, said intermediate level of said base is set such that said lower arm can be kept out of contact with one of the substrates when said lower arm is positioned under said one of the substrates which is placed on said station, and also such that one of the substrates can be kept out of contact with said station when said upper arm is positioned above said station together with said one of the substrates, and said lower level of said base is set such that said upper arm can be kept out of contact with one of the substrates when it is positioned under said one of the substrates placed on said station, said method comprising, so as to remove a first substrate, which is one of the substrates and mounted on said station, from said station by said lower arm, and to transfer a second substrate, which is one of the substrates and supported by said upper arm, from said upper arm onto said station, the steps of:

positioning said base at said intermediate level with said upper and lower arms positioned in retreat positions;

advancing said lower arm to a position under said first substrate while said base being positioned at said intermediate level;

moving said base up to said upper level after positioning said lower arm under said first substrate, thereby raising said first substrate from said station by said lower arm;

retreating said lower arm with said first substrate and advancing said upper arm with said second substrate while said base being positioned at said upper level;

moving said base down to said lower level after positioning said upper arm above said station and also after retreating said lower arm, thereby transferring said second substrate from said upper arm onto said station;

retreating said upper arm after transferring said second substrate onto said station; and confirming by an optical sensor as to whether said lower arm holds said first substrate while retreating said lower arm and advancing said upper arm, wherein said optical sensor comprises means for emitting light and means for receiving said light which are fixed relative to said base and connected to each other through and optical axis intersecting movement paths of said first and second substrates, and wherein said first substrate on said lower arm is sensed by said optical sensor when said optical axis intersects said first substrate on said lower arm and does not intersect said second substrate on said upper arm.

6. The method according to claim 5, wherein said retreat of said upper arm is initiated while said base being positioned at said lower level.

7. The method according to claim 5, wherein said retreat of said lower arm and said advance of said upper arm are performed substantially in synchronism.

8. The method according to claim 5, wherein an opening is formed in said upper arm such that said first substrate on said lower arm is sensed by said optical sensor when said optical axis intersects both of said opening of said upper arm and said first substrate on said lower arm at a same time.

9. A method of exchanging target substrates, employed in a semiconductor treatment system which has a station for mounting each substrate, and a transfer apparatus provided with a base vertically movable among upper, intermediate, and lower levels, and upper and lower arms for transferring the substrates, said upper and lower arms being vertically arranged on said base and supported by said base such that they can advance and retreat independent of each other, said station being formed such that each substrate can be transferred between said station and one of said upper and lower arms by moving said one of said arms in horizontal and vertical directions, wherein said upper level of said base is set such that one of the substrates can be kept out of contact with said station when said lower arm is positioned above said station together with said one of the substrates, said intermediate level of said base is set such that said lower arm can be kept out of contact with one of the substrates when said lower arm is positioned under said one of the substrates which is placed on said station, and also such that one of the substrates can be kept out of contact with said station when said upper arm is positioned above said station together with said one of the substrates, and said lower level of said base is set such that said upper arm can be kept out of contact with one of the substrates when it is positioned under said one of the substrates placed on said station, said method comprising, so as to remove a first substrate, which is one of the substrates and mounted on said station, from said station by said lower arm, and to transfer a second substrate, which is one of the substrates and supported by said upper arm, from said upper arm onto said station, the steps of:

positioning said base at said intermediate level with said upper and lower arms positioned in retreat positions;

advancing said lower arm to a position under said first substrate and advancing said upper arm with said second substrate while said base being positioned at said intermediate level;

moving said base up to said upper level after positioning said lower arm under said first substrate, thereby raising said first substrate from said station by said lower arm;

retreating said lower arm with said first substrate while said base being positioned at said upper level;

moving said base down to said lower level after positioning said upper arm above said station and also after retreating said lower arm, thereby transferring said second substrate from said upper arm onto said station; and retreating said upper arm after transferring said second substrate onto said station.

10. The method according to claim 9, wherein said retreat of said upper arm is initiated while said base being positioned at said lower level.

11. The method according to claim 9, wherein said advance of said lower arm and said advance of said upper arm are performed substantially in synchronism.

12. The method according to claim 9, further comprising the step of confirming by an optical sensor as to whether said lower arm holds said first substrate while retreating said lower arm, wherein said optical sensor comprises means for emitting light and means for receiving said light which are fixed relative to said base and connected to each other through an optical axis intersecting movement paths of said first and second substrates, and wherein said first substrate on said lower arm is sensed by said optical sensor when said optical axis intersects said first substrate on said lower arm and does not intersect said second substrate on said upper arm.

13. The method according to claim 12, wherein an opening is formed in said upper arm such that said first substrate on said lower arm is sensed by said optical sensor when said optical axis intersects both of said opening of said upper arm and said first substrate on said lower arm at a same time.

* * * * *